United States Patent
Kamimuta et al.

(10) Patent No.: US 9,761,798 B2
(45) Date of Patent: Sep. 12, 2017

(54) STORAGE DEVICE

(71) Applicant: Toshiba Memory Corporation, Tokyo (JP)

(72) Inventors: Yuuichi Kamimuta, Yokkaichi (JP); Shosuke Fujii, Kuwana (JP); Masumi Saitoh, Yokkaichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/062,379

(22) Filed: Mar. 7, 2016

(65) Prior Publication Data
US 2016/0359109 A1 Dec. 8, 2016

(30) Foreign Application Priority Data

Jun. 8, 2015 (JP) ................. 2015-116049

(51) Int. Cl.
*H01L 45/00* (2006.01)
*H01L 27/24* (2006.01)

(52) U.S. Cl.
CPC ........ *H01L 45/146* (2013.01); *H01L 27/2463* (2013.01); *H01L 27/2481* (2013.01); *H01L 45/04* (2013.01); *H01L 45/1233* (2013.01); *H01L 45/1253* (2013.01); *H01L 45/1675* (2013.01)

(58) Field of Classification Search
CPC . H01L 45/08; H01L 45/1233; H01L 45/1266; H01L 45/146
See application file for complete search history.

(56) References Cited

U.S. PATENT DOCUMENTS

| | | | |
|---|---|---|---|
| 5,825,609 | A | 10/1998 | Andricacos et al. |
| 2010/0320547 | A1 | 12/2010 | Ando et al. |
| 2013/0062588 | A1 | 3/2013 | Sakotsubo |
| 2014/0001573 | A1 | 1/2014 | Ando et al. |
| 2015/0333258 | A1 | 11/2015 | Fujii et al. |
| 2016/0359109 | A1* | 12/2016 | Kamimuta .............. H01L 45/04 |

FOREIGN PATENT DOCUMENTS

| | | |
|---|---|---|
| JP | 10-41478 | 2/1998 |
| JP | 10-242408 | 9/1998 |
| JP | 2007-266230 | 10/2007 |
| JP | 2011-3899 | 1/2011 |
| JP | 2013-58691 | 3/2013 |
| JP | 2015-61019 | 3/2015 |

* cited by examiner

*Primary Examiner* — Mark Prenty
(74) *Attorney, Agent, or Firm* — Oblon, McClelland, Maier & Neustadt, L.L.P.

(57) ABSTRACT

A storage device of an embodiment includes a first conductive layer containing a first element selected from the group consisting of Si, Ge, and a metal element, a second conductive layer including a first region containing a first metal element and carbon or nitrogen, a second region containing a second metal element and carbon or nitrogen, and a third region provided between the first region and the second region, the third region containing a third metal element, the standard free energy of formation of an oxide of the third metal element being smaller than the standard free energy of formation of an oxide of the first element, a ferroelectric layer provided between the first conductive layer and the second conductive layer, and a paraelectric layer provided between the first conductive layer and the ferroelectric layer.

20 Claims, 17 Drawing Sheets

FIG.13A
FIG.13B
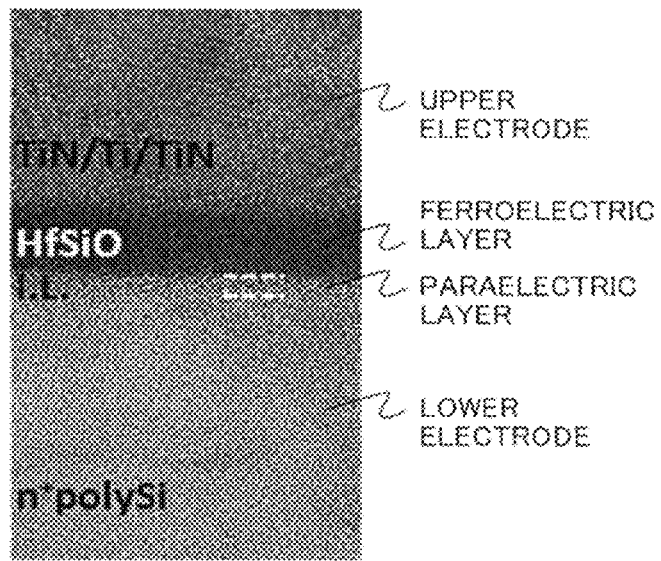

STORAGE DEVICE

CROSS-REFERENCE TO RELATED APPLICATION

This application is based upon and claims the benefit of priority from Japanese Patent Application No. 2015-116049, filed on Jun. 8, 2015, the entire contents of which are incorporated herein by reference.

FIELD

Embodiments described herein relate generally to storage devices.

BACKGROUND

Two-terminal resistive random access memories (ReRAM) are being developed as novel storage devices that may replace conventional floating gate type flash memories. A resistive random access memory generally has a cross-point structure in which memory cells each having a variable resistance element are arranged, in a matrix fashion, at the points of intersection between bit lines and word lines intersecting with the bit lines.

A resistive random access memory operates at a low voltage, performs high-speed switching, and can be subjected to scaling-down. In view of this, resistive random access memories are a strong candidate for next-generation large-capacity storage devices. Among those resistive random access memories, ferroelectric tunnel junction (FTJ) memories using ferroelectric thin films are drawing attention these days. An FTJ memory can perform a low-current operation, compared with the other resistive random access memories.

BRIEF DESCRIPTION OF THE DRAWINGS

FIGS. 13A and 13B are photographs of cross-sections of a memory cell in a storage device as an example of the first embodiment and a memory cell in a storage device as a comparative example;

DETAILED DESCRIPTION

A storage device of an embodiment includes: a first conductive layer containing a first element selected from the group consisting of Si, Ge, and a metal element; a second conductive layer including a first region containing a first metal element and at least one of carbon and nitrogen, a second region containing a second metal element and at least one of carbon and nitrogen, and a third region provided between the first region and the second region, the third region containing a third metal element, the standard free energy of formation of an oxide of the third metal element being smaller than the standard free energy of formation of an oxide of the first element; a ferroelectric layer provided between the first conductive layer and the second conductive layer; and a paraelectric layer provided between the first conductive layer and the ferroelectric layer.

In this specification, a "ferroelectric" material means a material that has spontaneous polarization without application of any electric field from outside. When an electric field is applied to the material from outside, the polarization is inverted. In this specification, a "paraelectric" material means a material in which polarization occurs when an electric field is applied to the material. When this electric field is removed, the polarization disappears.

The following is a description of embodiments, with reference to the accompanying drawings.

First Embodiment

A storage device of this embodiment includes: a first conductive layer containing a first element selected from the group consisting of Si, Ge, and a metal element; a second conductive layer including a first region containing a first metal element and carbon or nitrogen, a second region containing a second metal element and carbon or nitrogen, and a third region provided between the first region and the second region, the third region containing a third metal element, the standard free energy of formation of an oxide of the third metal element being smaller than the standard free energy of formation of an oxide of the first element; a ferroelectric layer provided between the first conductive layer and the second conductive layer; and a paraelectric layer provided between the first conductive layer and the ferroelectric layer.

Having the above structure, the storage device of this embodiment can be prevented from having an increase in the effective thickness of the paraelectric layer due to oxidization of the lower electrode. Thus, the ratio between the current value of a memory cell in an on state and the current value of the memory cell in an off state (on/off ratio) can be increased.

Figure 1:
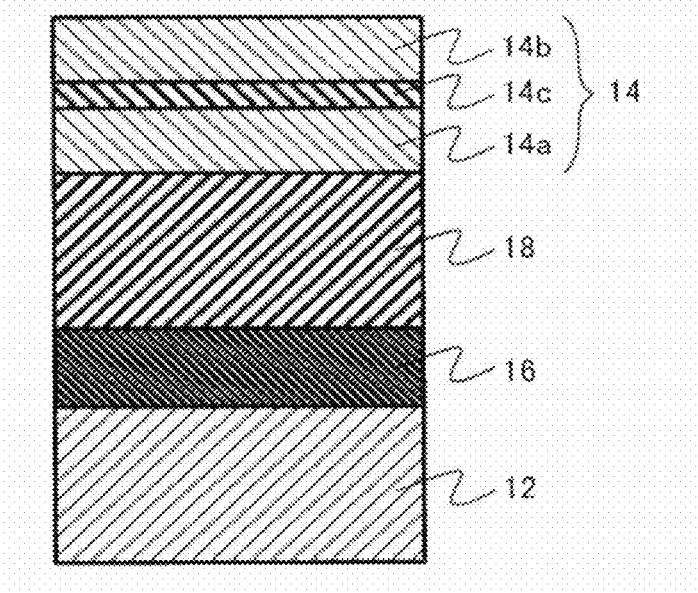
FIG. 1 is a schematic cross-sectional view of a memory cell of a storage device according to a first embodiment.
Figure 2:
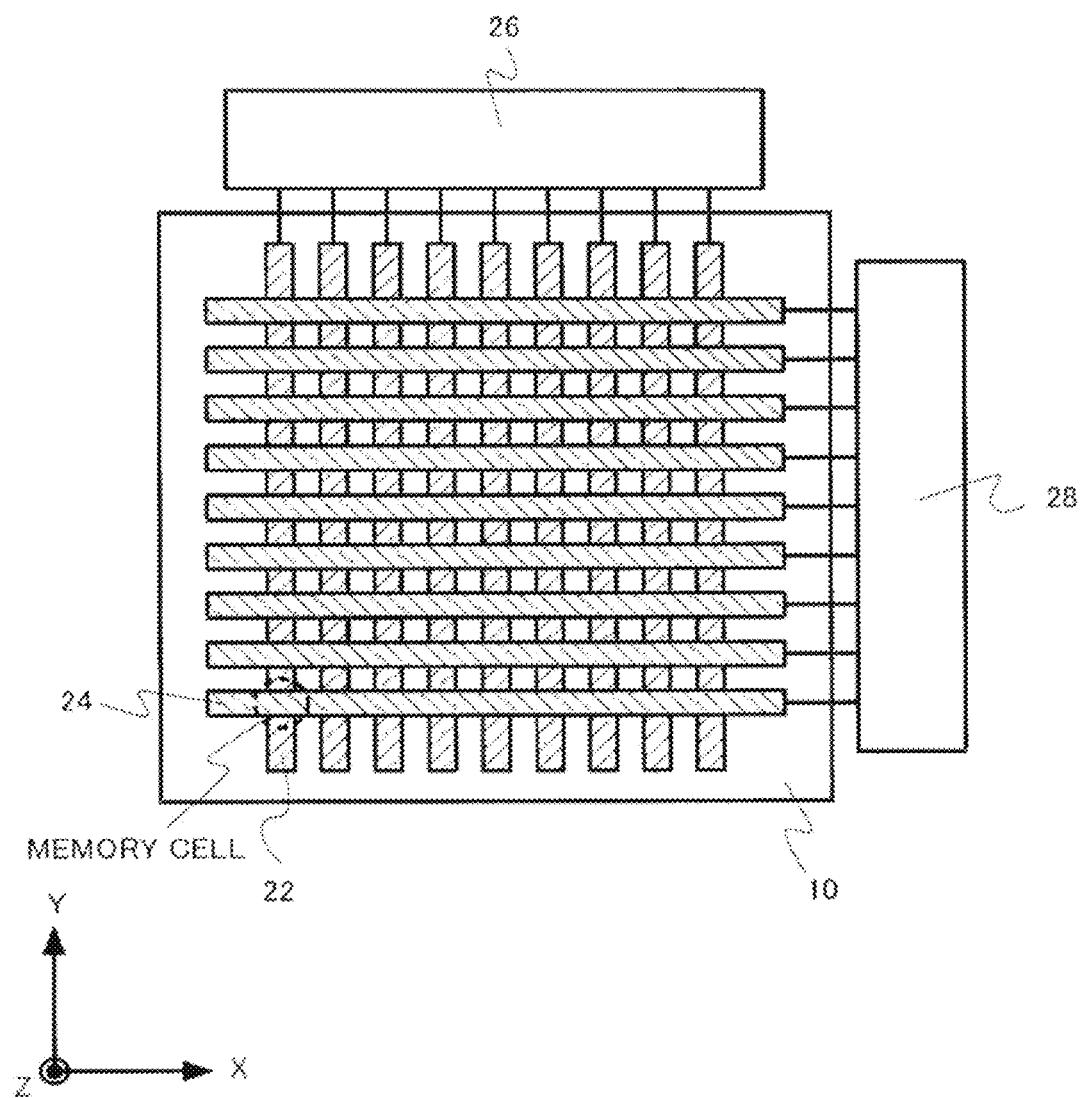
FIG. 2 is a conceptual diagram of the memory cell array of the storage device according to the first embodiment.

FIG. 1 is a schematic cross-sectional view of a memory cell of the storage device of this embodiment. FIG. 2 is a conceptual diagram of the memory cell array of the storage device of this embodiment. FIG. 1 shows a cross-section of one memory cell indicated by a dashed-line circle in the memory cell array in FIG. 2.

Figure 3:
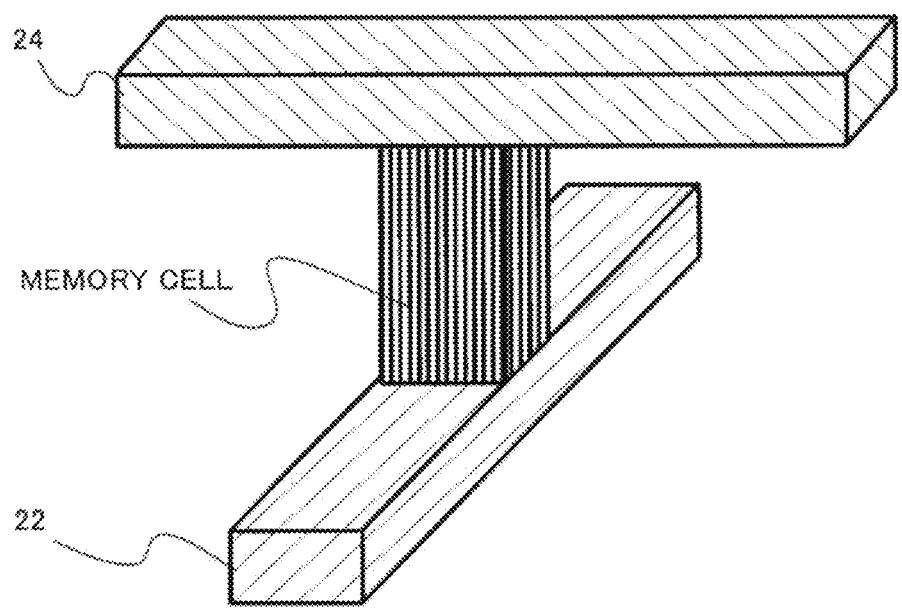
FIG. 3 is a perspective view of a memory cell unit of the storage device according to the first embodiment.
Figure 4A:
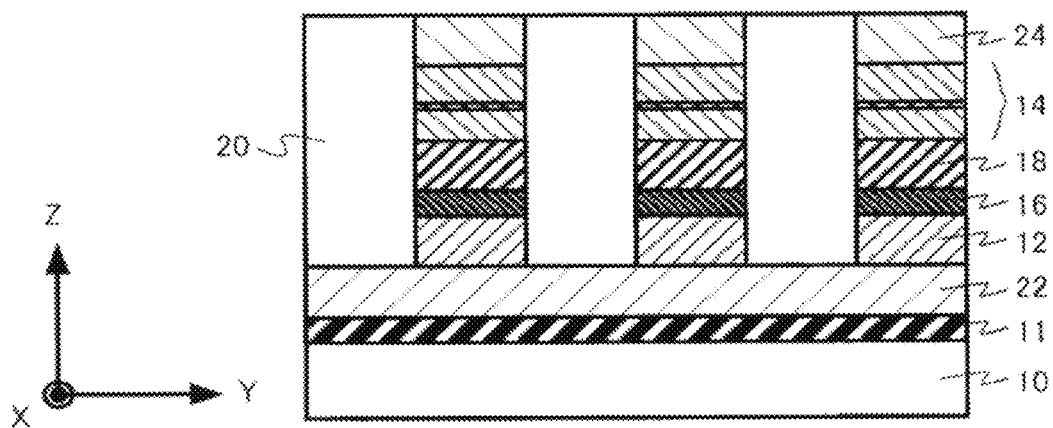
FIGS. 4A and 4B are cross-sectional views of the memory cell array of the storage device according to the first embodiment.
Figure 4B:
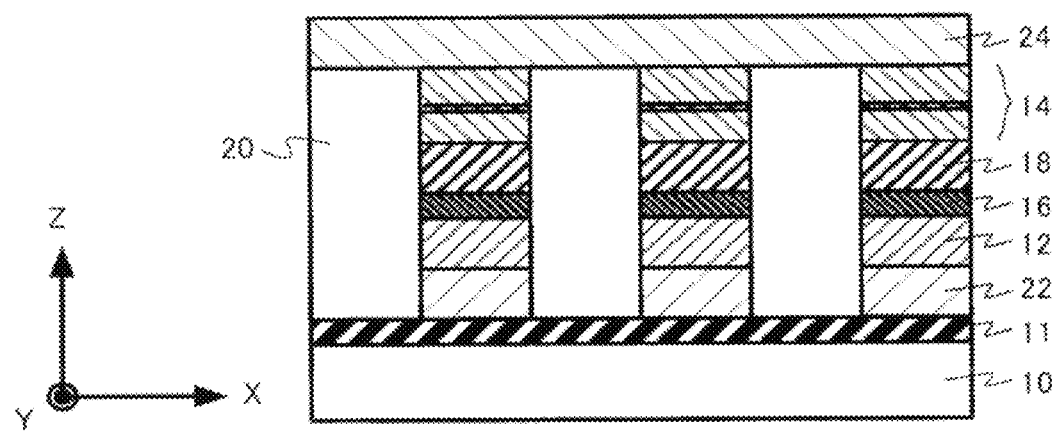

FIG. 3 is a perspective view of a memory cell unit of the storage device of this embodiment. FIGS. 4A and 4B are cross-sectional views of the memory cell array of the storage device of this embodiment. FIG. 4A shows a cross-section of the memory cell array, taken along the Y-Z axis shown in FIG. 2. FIG. 4B shows a cross-section of the memory cell array, taken along the X-Z axis shown in FIG. 2.

The storage device of this embodiment is an FTJ memory.

The storage device of this embodiment includes a semiconductor substrate 10, an insulating layer 11, a lower electrode (the first conductive layer) 12, an upper electrode (the second conductive layer) 14, a paraelectric layer 16, a ferroelectric layer 18, an interlayer insulating film 20, first wirings 22, second wirings 24, a first control circuit 26, and a second control circuit 28.

The memory cell array of the storage device of this embodiment is provided on the insulating layer 11 provided on the semiconductor substrate 10. The memory cell array includes the first wirings 22 and the second wirings 24 intersecting with the first wirings 22. For example, the second wirings 24 are provided on the upper layers of the first wirings 22. The first wirings 22 cross the second wirings 24 at right angles, for example.

The first wirings 22 are word lines, and the second wirings 24 are bit lines. The first wirings 22 and the second wirings 24 are metal lines, for example.

Memory cells are provided in the region where the first wirings 22 and the second wirings 24 intersect. The storage device of this embodiment has a so-called cross-point structure.

Each of the first wirings 22 is connected to the first control circuit 26. Each of the second wirings 24 is connected to the second control circuit 28.

The first control circuit 26 and the second control circuit 28 each have the function to select a desired memory cell, and write data into the memory cell, read data from the memory cell, or erase data in the memory cell, for example. The first control circuit 26 and the second control circuit 28 are formed with electronic circuits using semiconductor devices, for example.

As shown in FIG. 1, a memory cell is a two-terminal FTJ element interposed between the lower electrode (first conductive layer) 12 and the upper electrode (second conductive layer) 14. The memory cell includes the ferroelectric layer 18 between the lower electrode 12 and the upper electrode 14. The memory cell also includes the paraelectric layer 16 between the ferroelectric layer 18 and the lower electrode 12. At least one of the memory cells provided in the region where the first wirings 22 and the second wirings 24 intersect has the structure shown in FIG. 1.

The lower electrode 12 contains the first element selected from the group consisting of silicon (Si), germanium (Ge), and a metal element. The lower electrode 12 is a semiconductor, a metal, or a metal compound.

The metal element as the first element is an element selected from the group consisting of tantalum (Ta), niobium (Nb), vanadium (V), tungsten (W), iron (Fe), molybdenum (Mo), cobalt (Co), nickel (Ni), ruthenium (Ru), iridium (Ir), copper (Cu), palladium (Pd), silver (Ag), and platinum (Pt), for example.

The lower electrode 12 is a semiconductor selected from the group consisting of n-type polycrystalline silicon, p-type polycrystalline silicon, n-type polycrystalline silicon germanium, p-type polycrystalline silicon germanium, n-type polycrystalline germanium, and p-type polycrystalline germanium, or a metal selected from the group consisting of tantalum (Ta), niobium (Nb), vanadium (V), tungsten (W), iron (Fe), molybdenum (Mo), cobalt (Co), nickel (Ni), ruthenium (Ru), iridium (Ir), copper (Cu), palladium (Pd), silver (Ag), and platinum (Pt), for example.

The work function of the lower electrode 12 is preferably 4.5 eV or higher, to prevent oxidization of the lower electrode 12 due to detachment of oxygen (O), which is necessary for the ferroelectric layer 18 to have ferroelectricity.

Table 1 shows the work functions of the respective metals. Here, a work function is an energy difference between the Fermi level and the vacuum level of a conductive layer.

TABLE 1

| Element | Work function [eV] | Element | Work function [eV] |
|---|---|---|---|
| Pt | 5.65 | Zr | 4.05 |
| Ag | 4.26 | Ba | 2.7 |
| Pd | 5.12 | Al | 4.28 |
| Cu | 4.65 | Hf | 3.9 |
| Ir | 5.27 | Sr | 2.59 |
| Ru | 4.71 | La | 3.5 |
| Ni | 5.15 | Mg | 3.66 |
| Co | 5 | Nd | 3.2 |
| Mo | 4.6 | Yb | — |
| Fe | 4.5 | Sm | 2.7 |
| W | 4.55 | Dy | — |
| V | 4.3 | Lu | 3.3 |
| Nb | 4.3 | Ho | — |
| Ta | 4.25 | Tm | — |
| Ti | 4.33 | Er | — |
| Ce | 2.9 | Ca | 2.87 |
| Eu | 2.5 | Y | 3.1 |

As can be seen from Table 1, the lower electrode 12 is preferably a metal selected from the group consisting of tungsten (W), molybdenum (Mo), cobalt (Co), nickel (Ni), ruthenium (Ru), iridium (Ir), copper (Cu), palladium (Pd), and platinum (Pt).

Also, the lower electrode 12 preferably contains p-type polycrystalline silicon (Si), p-type polycrystalline silicon germanium (SiGe), or p-type polycrystalline germanium (Ge). Silicon (Si), silicon germanium (SiGe), and germanium (Ge), which are semiconductors, can have work functions of 4.5 eV or higher by conjoining boron (B), aluminum (Al), gallium (Ga), or indium (In), which is a p-type impurity.

Carbides and nitrides of group V elements such as tantalum (Ta), niobium (Nb), and vanadium (V) have work functions of 4.5 eV or higher. In view of this, the lower electrode 12 is preferably a metal compound selected from the group consisting of tantalum carbide, tantalum nitride, niobium carbide, niobium nitride, vanadium carbide, and vanadium nitride, for example.

The work functions of the metal carbides and the metal nitrides mentioned above as examples can be increased by adding oxygen thereto. The oxygen concentration of the lower electrode 12 formed with one of the above metal carbides or metal nitrides is preferably not lower than 1 atomic percent and not higher than 10 atomic percent. If the oxygen concentration is below this range, the effect to increase the work function might not be achieved. If the oxygen concentration is above this range, the on-state current of the memory cell might become lower.

The upper electrode 14 includes a first region 14a, a second region 14b, and a third region 14c. The third region 14c is provided between the first region 14a and the second region 14b.

The first region 14a contains the first metal element and carbon or nitrogen. The second region 14b contains the second metal element and carbon or nitrogen. Here, "containing carbon or nitrogen" means containing carbon and/or nitrogen. That is, the concept of "containing carbon or nitrogen" is inclusive of a case where both carbon and nitrogen are contained.

The first region 14a has a function of preventing a reaction between the ferroelectric layer 18 and the third region 14c. The second region 14b also has a function of preventing a reaction between the second wiring 24 and the third region 14c.

The first metal element is titanium (Ti), tantalum (Ta), or tungsten (W), for example. The second metal element is titanium (Ti), tantalum (Ta), or tungsten (W), for example.

The first region 14a contains titanium carbide, titanium nitride, tantalum carbide, tantalum nitride, tungsten carbide, or tungsten nitride, for example. The second region 14b contains titanium carbide, titanium nitride, tantalum carbide, tantalum nitride, tungsten carbide, or tungsten nitride, for example. The materials of the first region 14a and the second region 14b may be the same or may differ from each other. The first metal element and the second metal element may be the same or may differ from each other.

The first region 14a and the second region 14b are preferably metal carbides or metal nitrides that have lower reactivity than single-element metals.

The oxygen concentration of the third region 14c is preferably higher than the oxygen concentration of the first region 14a and the oxygen concentration of the second region 14b. The oxygen concentration distribution of the upper electrode 14 preferably has its peak in the third region 14c. The oxygen concentration distribution can be analyzed by SIMS (Secondary Ion Mass Spectrometry) or TEM-EELS (Electron Energy Loss Spectroscopy), for example.

The third region 14c contains the third metal element. The standard free energy of formation of an oxide of the third metal element is smaller than the standard free energy of formation of an oxide of the first element contained in the lower electrode 12. In other words, the third region 14c contains the third metal element that is more easily oxidized than the first element contained in the lower electrode 12.

Table 2 shows the standard free energies of formation of oxides of elements. A standard free energy of formation is a free energy of formation at 298.15 K and 1 atmosphere. Table 2 shows the standard free energies of formation per 1 mol of oxygen ($O_2$) in cases where oxides of various elements are generated at 298.15 K and 1 atmosphere.

When the standard free energy of formation is negative, the chemical reaction to generate an oxide is an exothermic reaction and develops in a spontaneous manner. An element forming an oxide having a small standard free energy of formation (a negative standard free energy of formation with a large absolute value) is an element that is easily oxidized.

TABLE 2

| Element | Oxide | Standard free energy of formation [kJ/mol] | Element | Oxide | Standard free energy of formation [kJ/mol] |
|---|---|---|---|---|---|
| Pt | $PtO_2$ | 92.3 | Zr | $ZrO_2$ | −1042.8 |
| Ag | $AgO_2$ | −22.4 | Ba | BaO | −1050.2 |
| Pd | PdO | −248.8 | Al | $Al_2O_3$ | −1054.9 |
| Cu | CuO | −259.4 | Hf | $HfO_2$ | −1088.2 |
| Ir | $IrO_2$ | −260.1 | Sr | SrO | −1123.8 |
| Ru | $RuO_2$ | −322.7 | La | $La_2O_3$ | −1137.2 |
| Ni | NiO | −423.4 | Mg | MgO | −1138.9 |
| Co | CoO | −428.4 | Nd | $Nd_2O_3$ | −1147.2 |
| Mo | $MoO_3$ | −446.0 | Yb | $Yb_2O_3$ | −1151.1 |
| Fe | $Fe_3O_4$ | −507.7 | Sm | $Sm_2O_3$ | −1156.4 |
| W | $WO_9$ | −509.4 | Dy | $Dy_2O_3$ | −1181.0 |
| V | $V_2O_5$ | −567.8 | Lu | $Lu_2O_3$ | −1192.7 |
| Nb | $Nb_2O_5$ | −706.4 | Ho | $Ho_2O_3$ | −1194.1 |
| Ta | $Ta_2O_5$ | −764.5 | Tm | $Tm_2O_3$ | −1196.3 |
| Si | $SiO_2$ | −856.6 | Er | $Er_2O_3$ | −1205.8 |
| Ti | $TiO_2$ | −884.5 | Ca | CaO | −1208.1 |
| Ce | $CeO_2$ | −1024.6 | Y | $Y_2O_3$ | −1211.1 |
| Eu | $Eu_2O_3$ | −1037.9 | | | |

In a case where the lower electrode 12 is polycrystalline silicon, for example, the third region 14c contains the third metal element that is a metal element forming an oxide having a smaller standard free energy of formation than that of an oxide of Si. Specifically, the third metal element is a metal element selected from the group consisting of titanium (Ti), cerium (Ce), europium (Eu), zirconium (Zr), barium (Ba), aluminum (Al), hafnium (Hf), strontium (Sr), lanthanum (La), magnesium (Mg), neodymium (Nd), ytterbium (Yb), samarium (Sm), dysprosium (Dy), lutetium (Lu), holmium (Ho), thulium (Tm), erbium (Er), calcium (Ca), and yttrium (Y).

The third region 14c contains titanium oxide, for example.

The ferroelectric layer 18 contains a metal oxide, for example. The ferroelectric layer 18 contains hafnium oxide or zirconium oxide, for example. To enhance ferroelectricity, the hafnium oxide preferably contains at least one element selected from the group consisting of silicon (Si), zirconium (Zr), aluminum (Al), yttrium (Y), strontium (Sr), lanthanum (La), cerium (Ce), gadolinium (Gd), and barium (Ba). Also, to enhance ferroelectricity, the zirconium oxide preferably contains at least one element selected from the group consisting of silicon (Si), hafnium (Hf), aluminum (Al), yttrium (Y), strontium (Sr), lanthanum (La), cerium (Ce), gadolinium (Gd), and barium (Ba).

The paraelectric layer 16 contains an oxide of a semiconductor or a metal oxide, for example. The paraelectric layer 16 contains silicon oxide, tantalum oxide, or tungsten oxide, for example.

The ferroelectric layer 18 and the paraelectric layer 16 form the resistance change layer of the FTJ element.

In the storage device of this embodiment, the first wirings 22 and the lower electrode 12 maybe integrated, or the second wirings 24 and the upper electrode 14 may be integrated. That is, the lower electrode 12 may serve as the first wirings 22, or the upper electrode 14 may serve as the second wirings 24.

FIGS. 5A through 10A and FIGS. 5B through 10B are schematic cross-sectional views of a storage device being manufactured by a storage device manufacturing method according to this embodiment. FIGS. 5A through 10A show cross-sections of the memory cell array, taken along the Y-Z axis shown in FIG. 2. FIGS. 5B through 10B show cross-sections of the memory cell array, taken along the X-Z axis shown in FIG. 2.

First, the insulating layer 11 is formed on the semiconductor substrate 10. The semiconductor substrate 10 is a single-crystal silicon substrate, for example. The insulating layer 11 is a silicon oxide layer, for example.

Figure 5A:
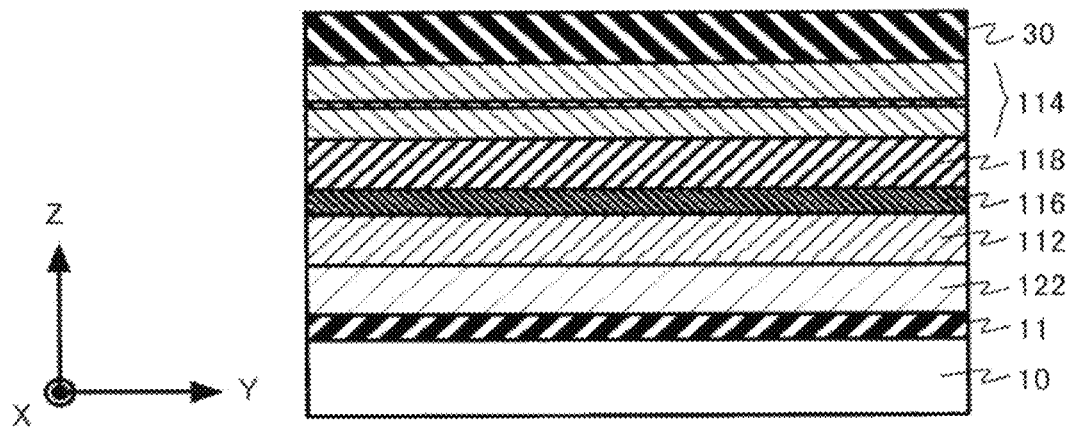
FIGS. 5A and 5B are schematic cross-sectional views of a storage device being manufactured by a method of the first embodiment.
Figure 5B:
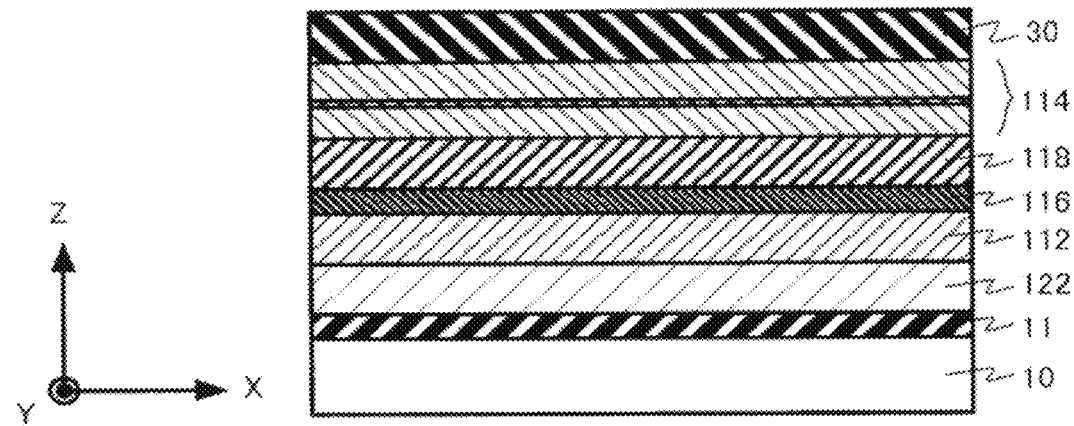

A conductive film 122, a conductive film 112, a paraelectric film 116, an amorphous film 118 to be the ferroelectric layer, a conductive film 114, and a hard mask 30 are formed on the insulating layer 11 (FIGS. 5A and 5B). The technique used in forming the respective films may be a sputtering technique, CVD (Chemical Vapor Deposition), ALD (Atomic Layer Deposition), or the like.

The conductive film 122 is a tungsten (W) film, for example. The conductive film 112 is an n-type polycrystalline silicon film, for example. The paraelectric film 116 is a silicon oxide film, for example. The amorphous film 118 is an amorphous hafnium oxide film containing silicon (Si), for example.

The conductive film 114 is a stacked film including the first region 14a, the second region 14b, and the third region 14c. The third region 14c is provided between the first region 14a and the second region 14b. The first region 14a is formed with titanium nitride, for example. The second region 14b is formed with titanium nitride, for example. The third region 14c is formed with titanium (Ti), for example. The hard mask 30 is a silicon oxide film or a silicon nitride film, for example.

Figure 6A:
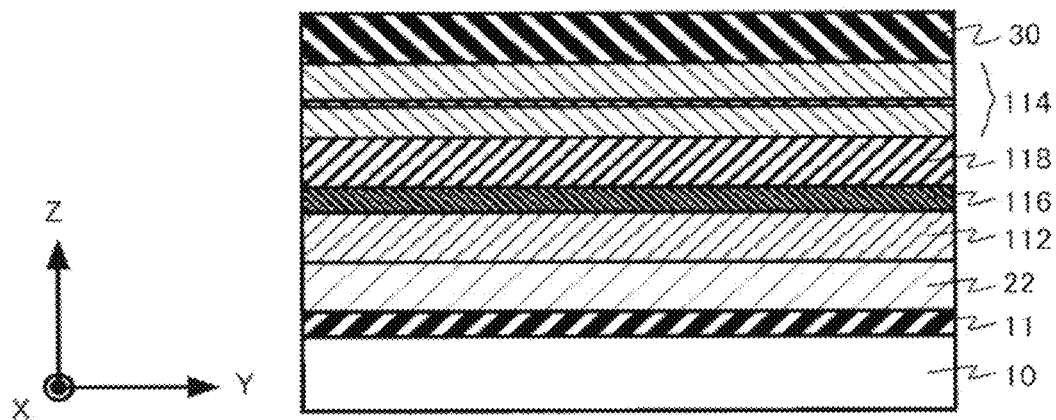
FIGS. 6A and 6B are schematic cross-sectional views of a storage device being manufactured by a method of the first embodiment.
Figure 6B:
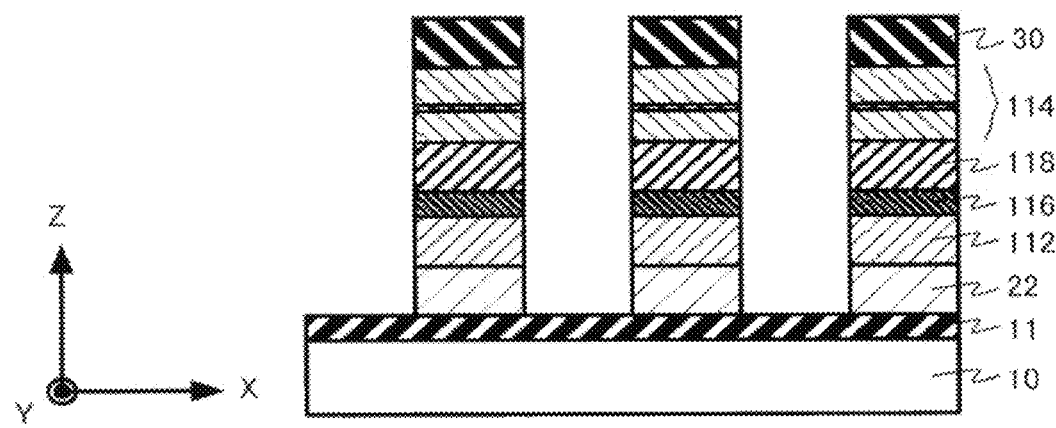

The hard mask 30 is then subjected to patterning in lines and spaces extending in the Y-direction by a lithography technique and an anisotropic etching technique such as RIE (Reactive Ion Etching). With the hard mask 30 serving as the mask, anisotropic etching is performed to pattern the conductive film 114, the amorphous film 118, the paraelectric film 116, the conductive film 112, and the conductive film 122 (FIGS. 6A and 6B).

The conductive film 114, the amorphous film 118, the paraelectric film 116, the conductive film 112, and the conductive film 122 are turned into lines and spaces extending in the Y-direction. The patterned conductive film 122 is turned into the first wirings (word lines) 22.

Figure 7A:
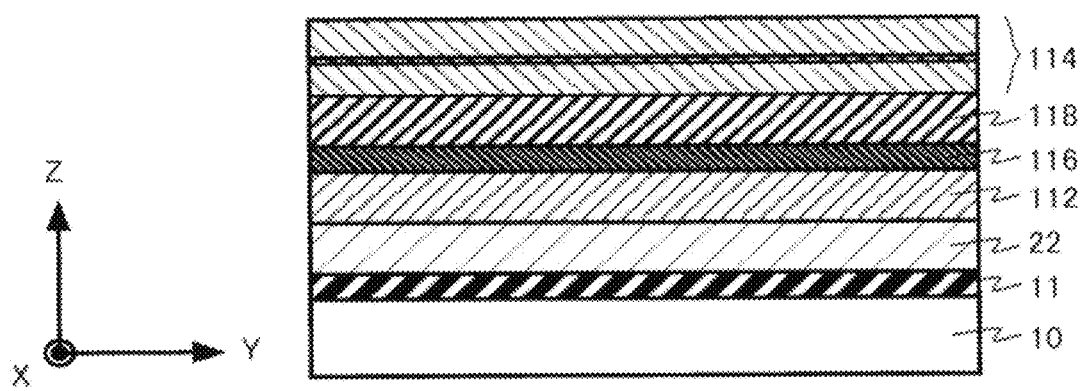
FIGS. 7A and 7B are schematic cross-sectional views of a storage device being manufactured by a method of the first embodiment.
Figure 7B:
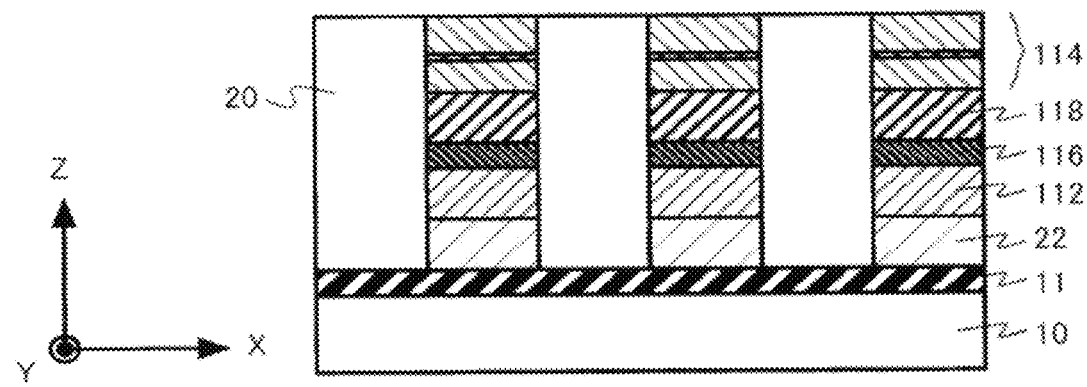

The interlayer insulating film 20 is then deposited. The interlayer insulating film 20 is a silicon oxide film, for example. The surface of the interlayer insulating film 20 and the hard mask 30 are removed by CMP (Chemical Mechanical Polishing), with the conductive film 114 serving as the stopper (FIGS. 7A and 7B).

Figure 8A:
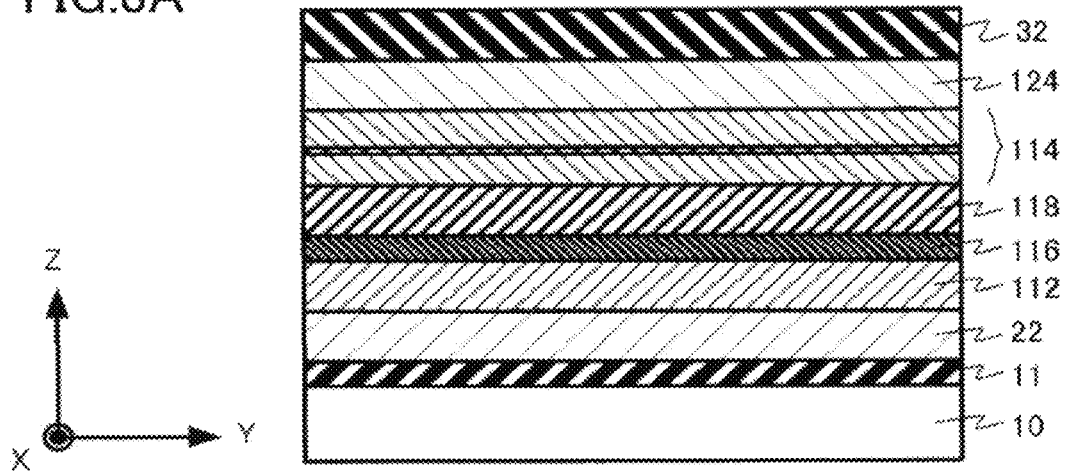
FIGS. 8A and 8B are schematic cross-sectional views of a storage device being manufactured by a method of the first embodiment.
Figure 8B:
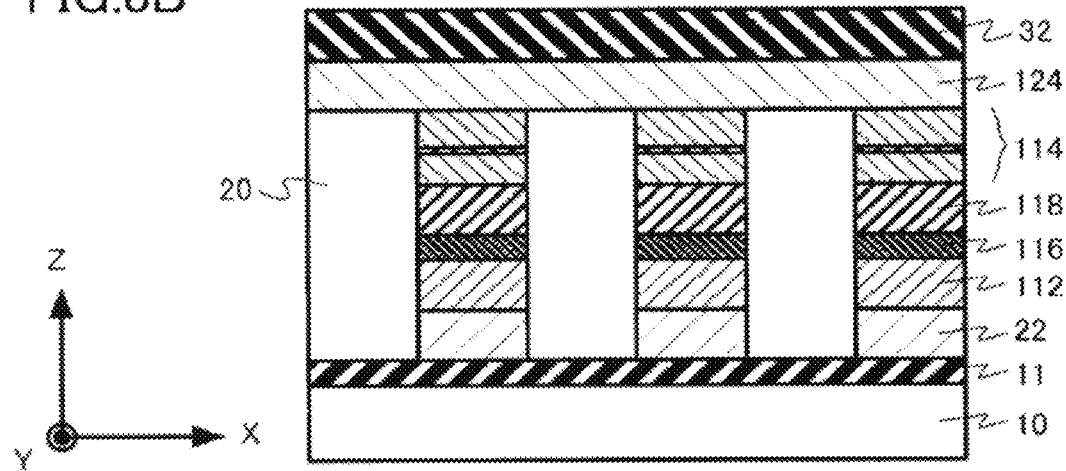

A conductive film 124 and a hard mask 32 are formed on the conductive film 114 and the interlayer insulating film 20 (FIGS. 8A and 8B). The conductive film 124 is a tungsten (W) film, for example. The hard mask 32 is a silicon oxide film or a silicon nitride film, for example.

Figure 9A:
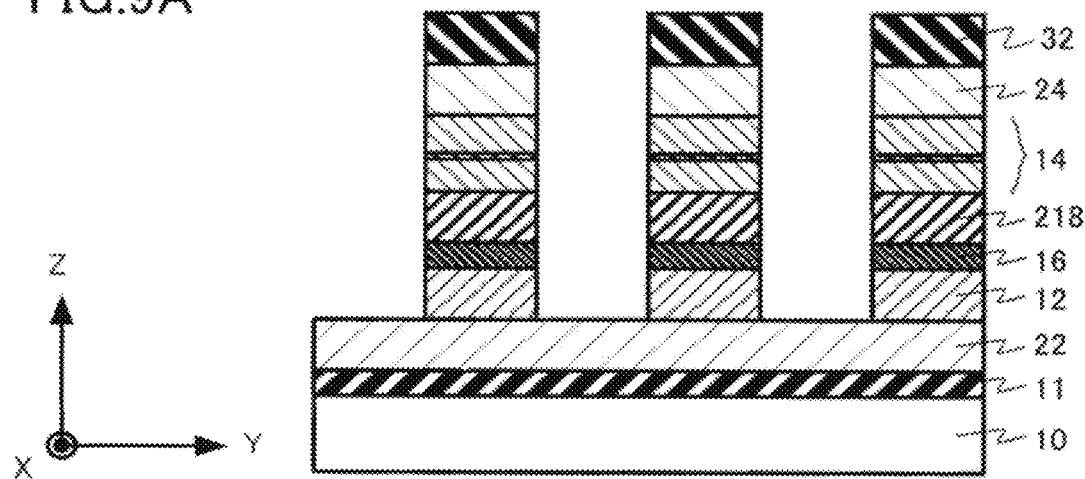
FIGS. 9A and 9B are schematic cross-sectional views of a storage device being manufactured by a method of the first embodiment.
Figure 9B:
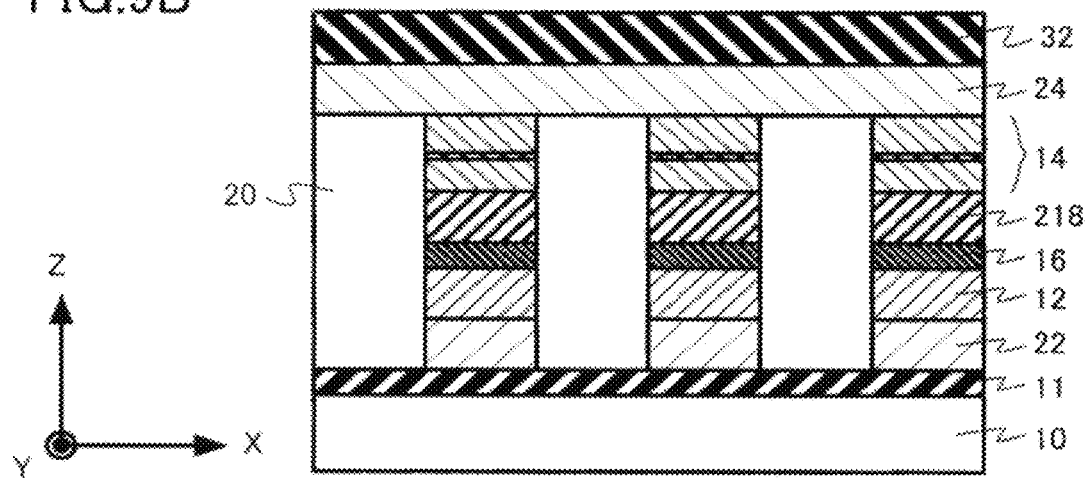

The hard mask 32 is then subjected to patterning in lines and spaces extending in the X-direction by a lithography technique and an anisotropic etching technique such as RIE. With the hard mask 32 serving as the mask, anisotropic etching is performed to pattern the conductive film 124, the conductive film 114, the amorphous film 118, the paraelectric film 116, the conductive film 112, and the interlayer insulating film 20 (FIGS. 9A and 9B).

The conductive film 124 is turned into lines and spaces extending in the X-direction. The patterned conductive film 124 is turned into the second wirings (bit lines) 24. The conductive film 114, the amorphous film 118, the paraelectric film 116, and the conductive film 112, which have been patterned, turn into the upper electrode (second conductive layer) 14, an amorphous layer 218, the paraelectric layer 16, and the lower electrode (first conductive layer) 12 that are divided and provided at the points of intersection between the first wirings (word lines) 22 and the second wirings (bit lines) 24.

Figure 10A:
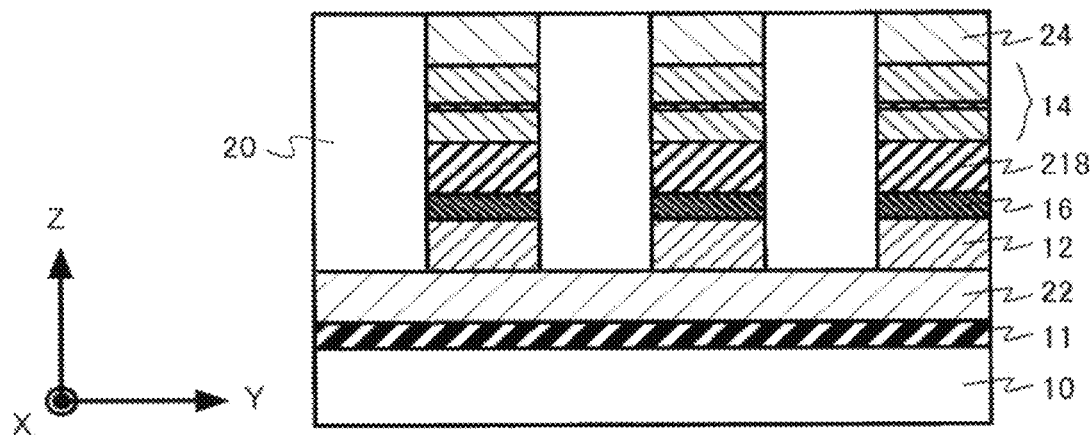
FIGS. 10A and 10B are schematic cross-sectional views of a storage device being manufactured by a method of the first embodiment.
Figure 10B:
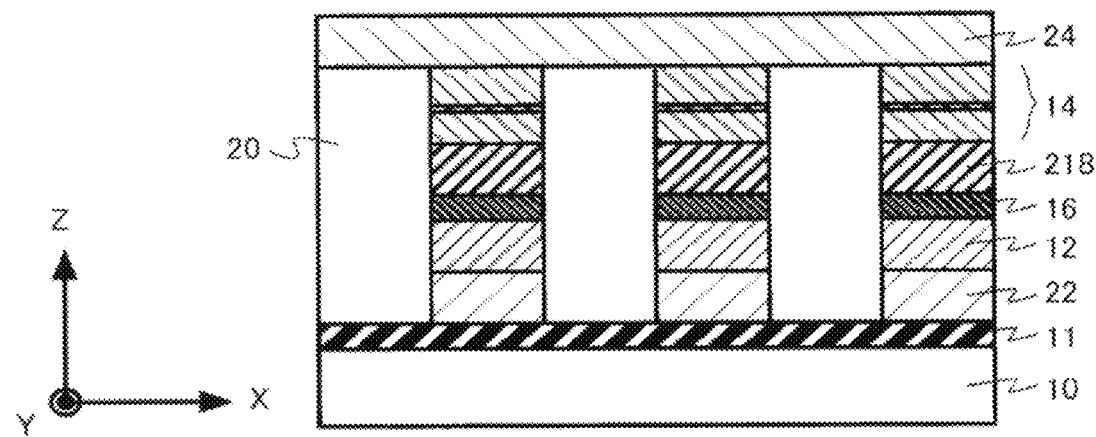

The interlayer insulating film 20 is then deposited. The interlayer insulating film 20 is a silicon oxide film, for example. The surface of the interlayer insulating film 20 and the hard mask 32 are then removed by CMP, with the second wirings (bit lines) 24 serving as the stoppers (FIGS. 10A and 10B).

A heat treatment is then performed to crystallize the amorphous layer 218. The amorphous layer 218 provided between the upper electrode 14 and the lower electrode 12 is crystallized by the heat treatment, and then turns into the ferroelectric layer 18 having ferroelectricity. The heat treatment is performed in a non-oxidizing atmosphere such as an inert gas atmosphere.

The heat treatment temperature is not lower than 600° C. and not higher than 1100° C., for example. The heat treatment time is not shorter than 1 second and not longer than 100 seconds, for example.

During the heat treatment, at least part of the third region 14c of the upper electrode 14 is oxidized by the oxygen supplied from the amorphous layer 218, for example. In a case where the third region 14c is formed with titanium (Ti), for example, titanium oxide is formed as a result of the heat treatment.

By the above described manufacturing method, the storage device of this embodiment is manufactured.

Next, the functions and the effects of the storage device of this embodiment are described in detail.

Figure 11:
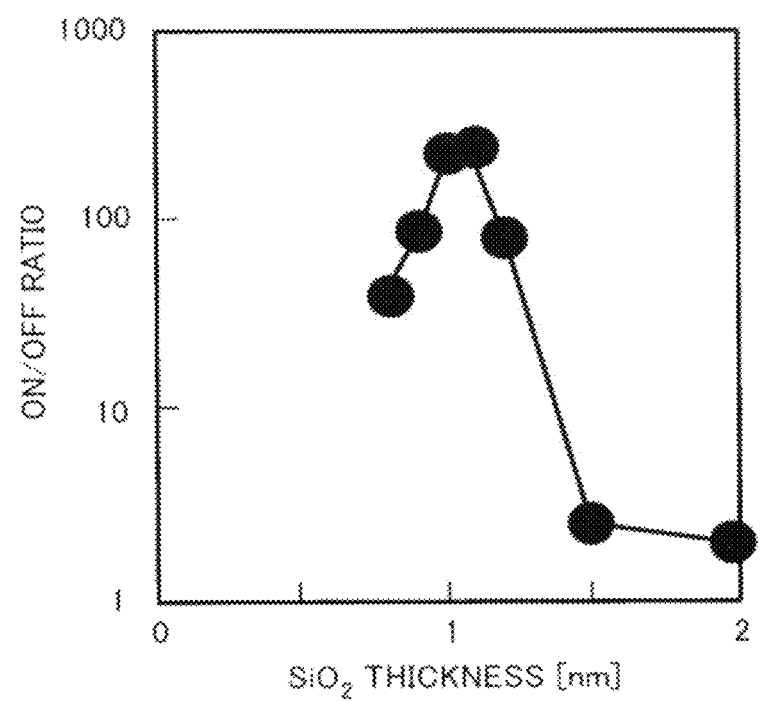
FIG. 11 shows the results of a simulation of the relationship between the on/off ratio of the current value and the thickness of the paraelectric layer in the storage device of the first embodiment.

FIG. 11 shows the results of a simulation of the relationship between the on/off ratio of the current value and the thickness of the paraelectric layer in the storage device of the first embodiment. The paraelectric layer is a silicon oxide layer, and the ferroelectric layer is a hafnium oxide layer of 4 nm in thickness. In the simulation, the coercive electric field of the ferroelectric layer was determined to be 1 MV/cm, and the polarization quantity was determined to be 25 $\mu C/cm^2$.

The horizontal axis in FIG. 11 indicates the thickness of the silicon oxide layer. The vertical axis indicates the on/off ratio of the current value, or the ratio between the current value of a memory cell in a low-resistance state (an on state) and the current value of the memory cell in a high-resistance state (an off state).

Where the on/off ratio of the current value is higher, data determination at a time of data reading from the memory cell is easier. This means that the memory operation is more stable when the on/off ratio of the current value is higher. As is apparent from FIG. 11, the on/off ratio of the current value varies with the thickness of the silicon oxide layer.

To achieve a stable memory operation, the on/off ratio of the current value is preferably 10 or higher. In view of this, the thickness of the silicon oxide layer is preferably 1.4 nm or smaller. To further increase the stability of the memory operation, the on/off ratio of the current value is preferably 100 or higher. In view of this, the thickness of the silicon oxide layer is preferably not smaller than 0.8 nm and not greater than 1.2 nm.

The dependence of the on/off ratio of the current value on the thickness of the paraelectric layer can be qualitatively explained as follows.

Figure 12A:
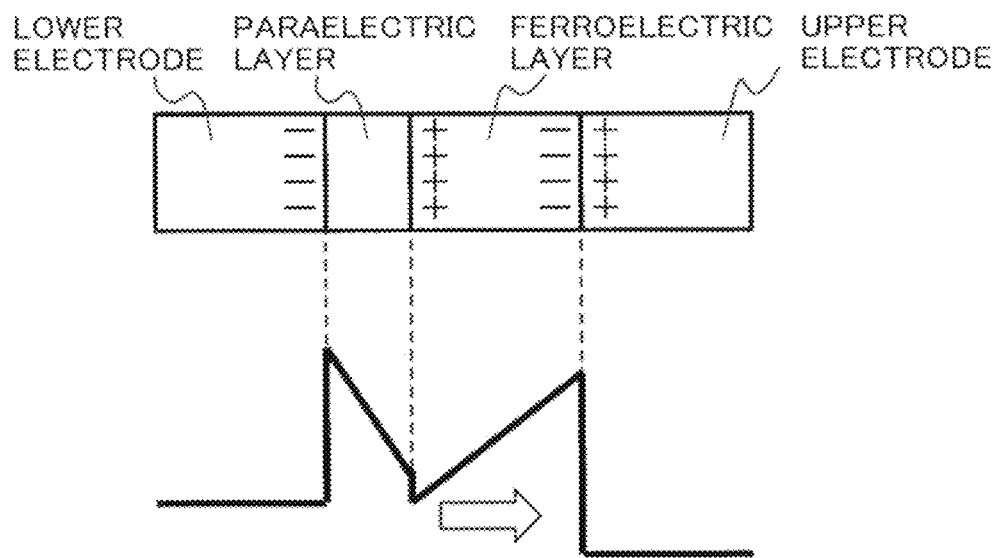
FIGS. 12A and 12B are schematic diagrams showing the band structures of memory cells in the storage device of the first embodiment.
Figure 12B:
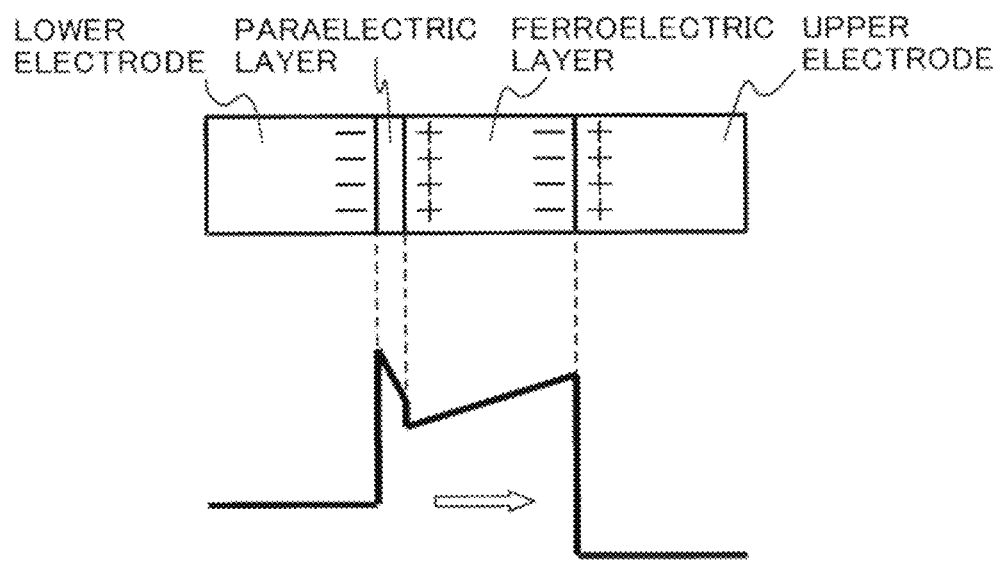

FIGS. 12A and 12B are schematic diagrams showing the band structures of memory cells in the storage device of the first embodiment. FIG. 12A shows a case where the paraelectric layer is thick. FIG. 12B shows a case where the paraelectric layer is thin.

There is spontaneous polarization on the surface of the ferroelectric layer, without any application of an electric field from outside. When an electric field is applied from outside, the spontaneous polarization is inverted. The intensity of the electric field at the time of the inversion of the spontaneous polarization is called the coercive electric field.

A case where the ferroelectric layer and the paraelectric layer are stacked to form a resistance change layer is now described. As shown in FIG. 12A, where the paraelectric layer is thick, the internal electric field (indicated by an arrow in the drawing) generated by the spontaneous polarization is large. When the internal electric field is larger than the coercive electric field, the polarization inversion becomes unstable. Because of this, in the case where the paraelectric layer is thick, polarization inversion might partially occur to make the internal electric field smaller than the coercive electric field.

As shown in FIG. 12B, where the paraelectric layer is thin, on the other hand, the internal electric field (indicated by an arrow in the drawing) generated by the spontaneous polarization is small. As a result, the partial polarization inversion is supposed to be smaller than that in a case where the paraelectric layer is thick.

In view of this, a reduction in the thickness of the paraelectric layer eventually causes an increase in the polarization quantity remaining in the ferroelectric layer. Thus, the on/off ratio of the current value qualitatively becomes higher.

If the paraelectric layer becomes too thin, however, the direct tunneling current flowing in the paraelectric layer dramatically increases. As a result, the off-state current of the memory cell also dramatically increases. Furthermore, as the distance between the upper and lower electrodes becomes shorter, the shielding distance becomes shorter, and the band modulation amount becomes smaller accordingly. In view of this, if the paraelectric layer is too thin, the on/off ratio of the current value becomes lower.

As is apparent from the above simulation results, the thickness of the paraelectric layer should be adjusted to an appropriate value, so as to increase the on/off ratio of the current value.

FIGS. 13A and 13B are photographs of cross-sections of a memory cell in a storage device as an example of this embodiment and a memory cell in a storage device as a comparative example. FIG. 13A shows the comparative example, and FIG. 13B shows the example. The photographs of the cross-sections are images formed by transmission electron microscopy (TEM).

In the comparative example, the lower electrode 12 is n-type polycrystalline silicon having phosphorus (P) added as an impurity thereto. The paraelectric layer 16 is a silicon oxide layer, and the ferroelectric layer 18 is a silicon-containing hafnium oxide layer. The upper electrode 14 is titanium nitride.

The example differs from the comparative example in the upper electrode 14. The upper electrode 14 is a stacked film including the first region 14a, the second region 14b, and the third region 14c. The first region 14a and the second region 14b are formed with titanium nitride, and the third region 14c is formed with titanium. At least part of the third region 14c is formed with titanium oxide.

In the example, the third region 14c of the upper electrode 14 contains titanium (Ti) as the third metal element. The lower electrode 12 contains silicon (Si) as the first element.

The standard free energy of formation of titanium oxide as an oxide of titanium (Ti) is smaller than the standard free energy of formation of silicon oxide as an oxide of silicon (Si).

As shown in FIG. 13A, in the memory cell of the comparative example, the thickness of the paraelectric layer 16 (the distance between the white dashed lines in the drawing) is 1.7 nm. As shown in FIG. 13B, in the memory cell of the example, the thickness of the paraelectric layer 16 (the distance between the white dashed lines in the drawing) is 1.2 nm. The thickness of the paraelectric layer 16 of the example is smaller than the thickness of the paraelectric layer 16 of the comparative example.

In a case where a hafnium oxide layer is used as the ferroelectric layer 18, orthorhombic crystals in a metastable phase should be formed as a crystal structure of hafnium oxide, so that the ferroelectric layer 18 exhibits ferroelectricity. In forming the orthorhombic crystals, a short-time heat treatment at a high temperature should be performed, depending on the contained element(s).

For example, hafnium oxide containing silicon exhibits ferroelectricity after a 10-second heat treatment at 1000° C. During the heat treatment, a small amount of oxygen (O) is detached from the hafnium oxide, and the n-type polycrystalline silicon serving as the lower electrode 12 is oxidized. Consequently, in the comparative example, the thickness of the silicon oxide layer formed as a result of the oxidation of the lower electrode 12 is added to the thickness of the silicon oxide layer serving as the paraelectric layer 16, and the effective thickness of the paraelectric layer 16 becomes greater.

After the heat treatment, the hafnium oxide containing silicon stabilizes with a small amount of oxygen (O) defect.

In the memory cell of the example, on the other hand, titanium (Ti) having a small standard free energy of formation as an oxide is added to the upper electrode 14 on the hafnium oxide. During the heat treatment to achieve ferroelectricity, the oxygen (O) detached from the hafnium oxide reacts with the titanium in the upper electrode 14, and turns into titanium oxide, which then stabilizes. Since the standard free energy of formation of an oxide of silicon contained in the lower electrode 12 is larger than that of titanium, oxidization of the n-type polycrystalline silicon serving as the lower electrode 12 is prevented. Consequently, the effective thickness of the paraelectric layer 16 becomes smaller than that in the comparative example.

Figure 14A:
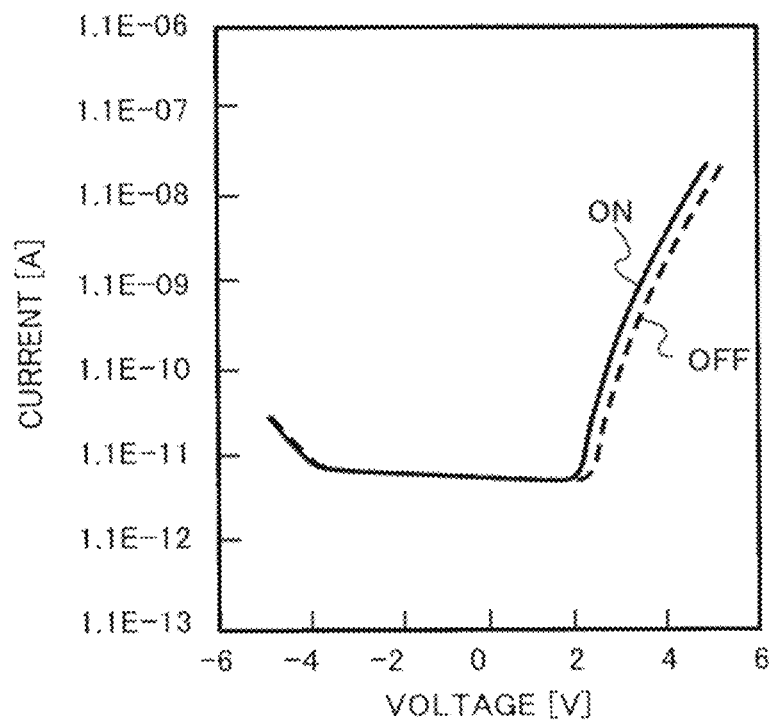
FIGS. 14A and 14B are graphs showing the results of measurement of the current-voltage characteristics (I-V characteristics) of a storage device as an example of the first embodiment and a storage device as a comparative example.
Figure 14B:
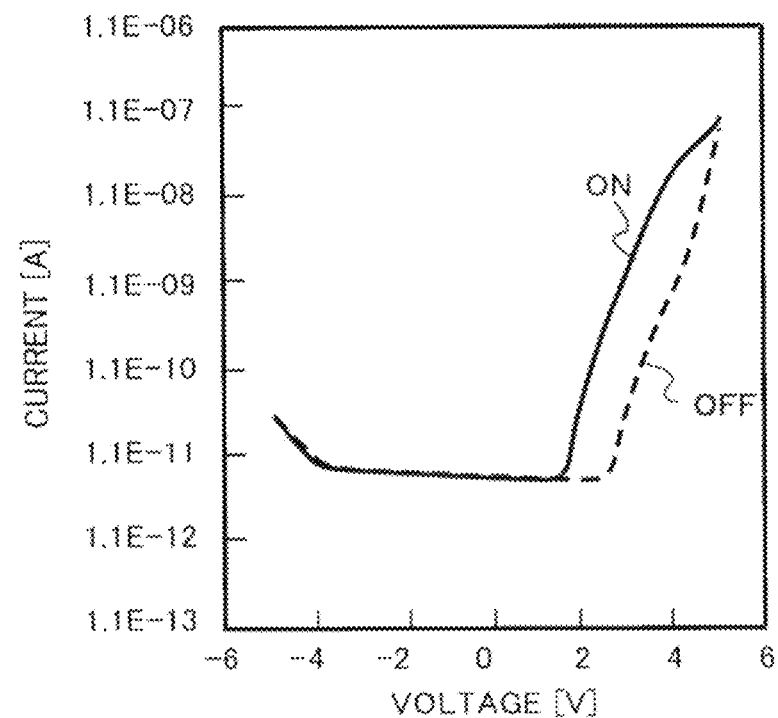

FIGS. 14A and 14B are graphs showing the results of measurement of the current-voltage characteristics (I-V characteristics) of the storage device of the example of this embodiment and the storage device of the comparative example. FIG. 14A shows the I-V characteristics of a memory cell of the comparative example. FIG. 14B shows the I-V characteristics of a memory cell of the example.

When a positive voltage is applied to a memory cell, the spontaneous polarization of the ferroelectric layer 18 is inverted. As the polarization inversion is caused, the electron energy barrier becomes smaller. Consequently, a tunneling current easily flows, and a change from a high-resistance state to a low-resistance state occurs (this change will be hereinafter referred to as the setting operation).

When a negative voltage is applied to a memory cell, on the other hand, polarization inversion occurs in the opposite direction from that in the case where a positive voltage is applied. In this case, the electron energy barrier becomes larger. Consequently, a tunneling current does not easily flow, and a change from a low-resistance state to a high-resistance state occurs (this change will be hereinafter referred to as the resetting operation).

In the comparative example shown in FIG. 14A, the ratio between the current value in the low-resistance state (indicated by the solid line in the graph) and the current value in the high-resistance state (indicated by the dashed line in the graph) is as low as 2. In other words, the on/off ratio of the current value is approximately 2. As a result, determination at a time of reading data from the memory cell is difficult, and a stable memory operation is not performed.

In the example shown in FIG. 14B, on the other hand, the read voltage of the memory cell is adjusted, so that the on/off ratio of the current value can be maintained at approximately 100. Thus, a stable memory operation can be performed.

The above results of the measurement correspond to the simulation results shown in FIG. 11. An increase in the on/off ratio of the current value can be regarded as an effect of the reduction in the effective thickness of the paraelectric layer 16.

As shown in FIGS. 14A and 14B, the current value (on-state current) in the low-resistance state (on state) in the example is larger than that in the comparative example. This is because the effective thickness of the paraelectric layer 16 is smaller, and a tunneling current easily flows in the example.

An excessive increase in the low-resistance state leads to an increase in power consumption. However, an excessively small current value in the low-resistance state causes the circuit to misjudge the on/off state, and a stable memory operation is not performed. According to this embodiment, the on-state current becomes larger, and a stable memory operation is performed accordingly.

As for the current value at a time when the voltage is swept in the negative direction, a sufficiently low current value is obtained in the example. Thus, the memory cell can have a rectifying function even in a case where the effective thickness of the paraelectric layer 16 is small as described above.

In a memory cell array having a cross-point structure, each memory cell preferably has a rectifying function, so as to reduce stray currents flowing via the memory cells. According to this embodiment, each memory cell has a rectifying function, and accordingly, a storage device having a cross-point structure can be manufactured without any addition of a diode or the like. This enables scaling-down of the memory cells. Furthermore, the manufacturing of the memory cells becomes easier.

As described above, to prevent oxidization of the lower electrode 12, the work function of the lower electrode 12 is preferably 4.5 eV or higher.

Figure 15:
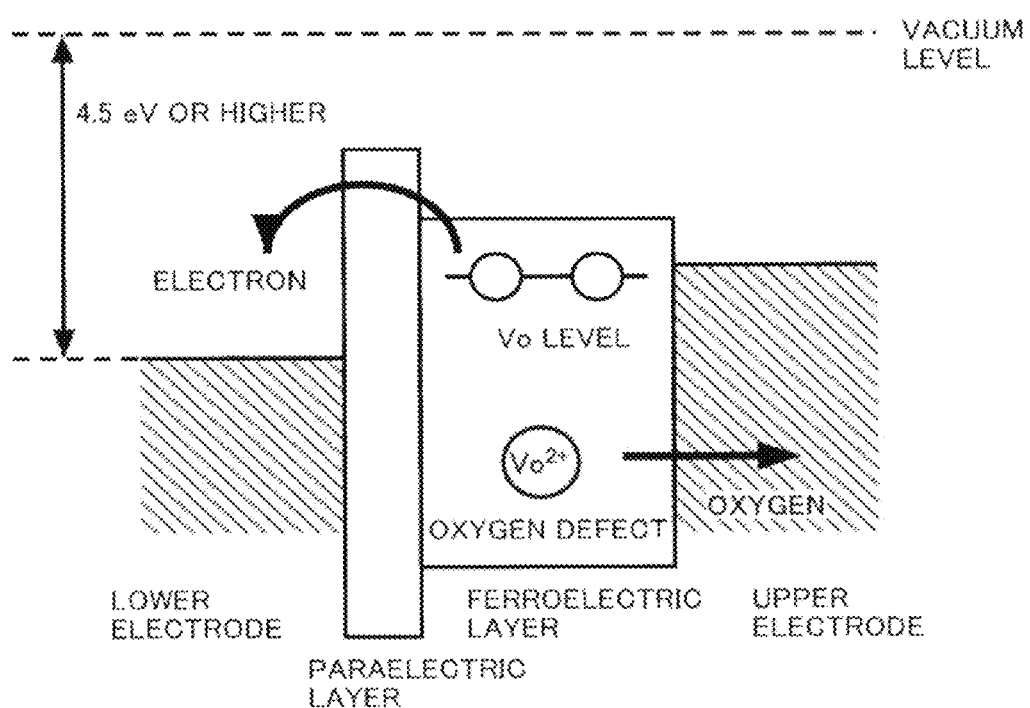
FIG. 15 is a band diagram of a memory cell of the storage device of the first embodiment in which the work function of the lower electrode is equal to or higher than 4.5 eV.

FIG. 15 is a band diagram of a memory cell in which the work function of the lower electrode is equal to or higher than 4.5 eV.

In a case where a hafnium oxide layer is used as the ferroelectric layer 18, for example, a short-time heat treatment at a high temperature should be performed to cause the ferroelectric layer 18 to exhibit ferroelectricity. During the heat treatment, oxygen (O) is detached from the hafnium oxide layer. The detached oxygen is captured by the third region 14c of the upper electrode 14 and forms an oxide, or causes oxidation of the lower electrode 12.

After the heat treatment, the hafnium oxide layer stabilizes with a small amount of oxygen (O) defect. The oxygen (O) defect state (Vo) easily spreads into the interface between the hafnium oxide layer and the paraelectric layer 16, or into the interface between the hafnium oxide layer and the upper electrode 14. After that, the defect state (Vo) releases two electrons in the interface between the hafnium oxide layer and the paraelectric layer 16, or in the interface between the hafnium oxide layer and the upper electrode 14. Consequently, a positive-divalent charged state ($Vo^{2+}$) appears and stabilizes.

The level (Vo level) formed by the oxygen (O) defect state (Vo) is an energy level at approximately 4.4 eV. In a case where the work function of the lower electrode 12 is equal to or higher than 4.5 eV, the energy gain at the time when electrons are released from the Vo level into the lower electrode 12 is large. As a result, electrons move into the lower electrode 12, and the Vo level easily stabilizes as a positive-divalent charged state ($Vo^{2+}$).

As the oxygen (O) defect state (Vo) easily stabilizes, detachment of oxygen (O) from the ferroelectric layer 18 is facilitated. However, the detached oxygen (O) is captured by the third region 14c of the upper electrode 14. As a result, the supply of oxygen from the ferroelectric layer 18 to the lower electrode 12 is reduced. Consequently, oxidization of the lower electrode 12 is more effectively prevented. Thus, the effective thickness of the paraelectric layer 16 can be made even smaller.

Although a hafnium oxide layer is used as the ferroelectric layer 18 in the above described case, the same functions and the effects as above can be achieved in a case where a zirconium oxide layer is used, for example.

In the storage device of this embodiment, the ratio between the current value of a memory cell in an on state and the current value of the memory cell in an off state can be increased. The current value in an on state can also be made larger. Thus, a storage device that is capable of performing a stable memory operation is obtained.

Second Embodiment

A storage device of this embodiment differs from that of the first embodiment in that the memory cell array has a multi-layer structure. The same explanations as those in the first embodiment will not be repeated.

Figure 16A:
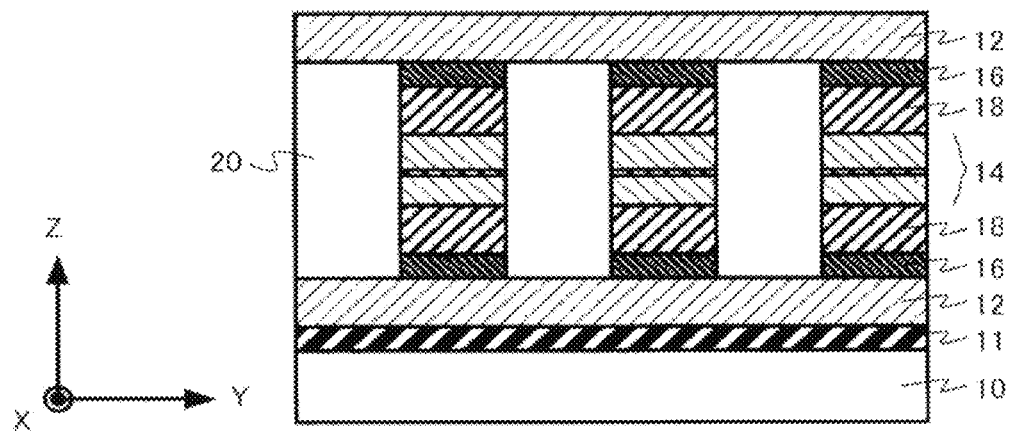
FIGS. 16A and 16B are cross-sectional views of the memory cell array of a storage device according to a second embodiment.
Figure 16B:
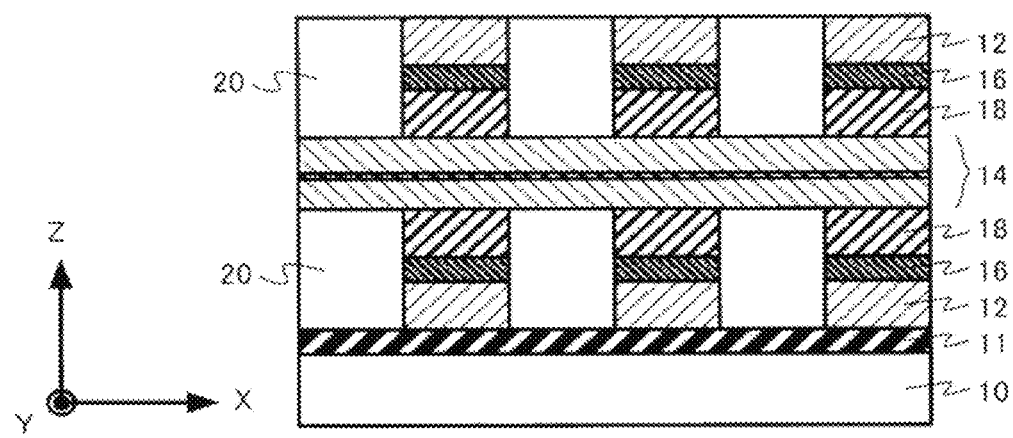

FIGS. 16A and 16B are cross-sectional views of the memory cell array of the storage device of this embodiment. FIG. 16A shows a cross-section of the memory cell array, taken along the Y-Z axis. FIG. 16B shows a cross-section of the memory cell array, taken along the X-Z axis.

In the storage device of this embodiment, two lower electrodes 12 are provided above and below an upper electrode 14. The upper electrode 14 extends in the X-direction, and also serves as the bit lines (second wirings). The lower electrodes 12 extend in the Y-direction, and also serve as the word lines (first wirings).

In the storage device of this embodiment, two layers of word lines and one layer of bit lines are stacked in the Z-direction. In each of the regions where the word lines and the bit lines intersect, two memory cells are stacked in the Z-direction.

As the memory cell array has the above described multi-layer structure, the storage device of this embodiment can achieve higher integration of memory cells, as well as the same effects as those of the first embodiment. In the example shown in FIGS. 16A and 16B, two layers of word lines and one layer of bit lines are stacked in the Z-direction. However, a larger number of layers of word lines and a larger number of layers of bit lines may be alternately stacked, to further Increase the degree of integration of memory cells.

Third Embodiment

A storage device of this embodiment differs from that of the second embodiment in that the ferroelectric layers and the paraelectric layers are not divided in the word line direction (Y-direction) and the bit line direction (X-direction). Explanation of the same aspects of those of the first or second embodiment will not be repeated in the description below.

Figure 17A:
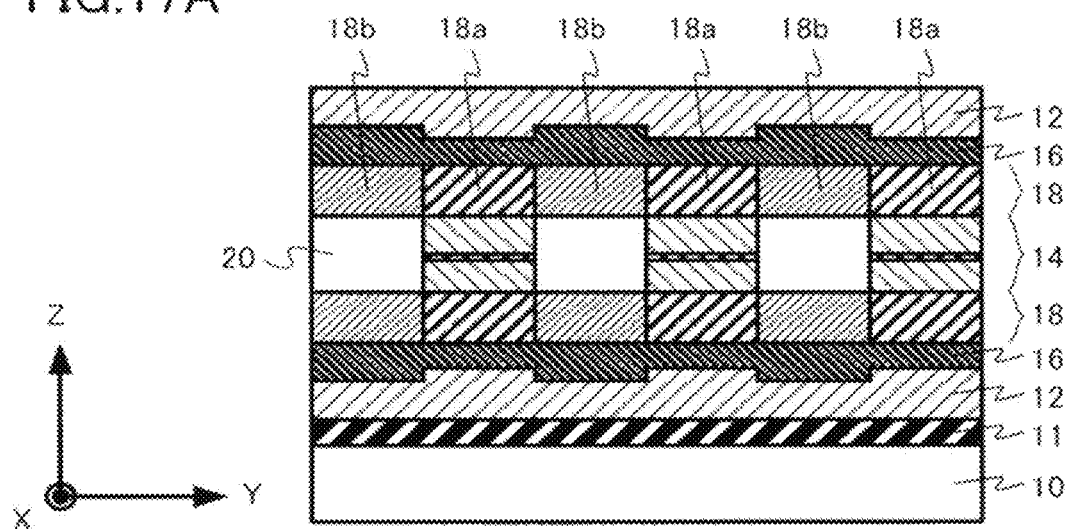
FIGS. 17A and 17B are cross-sectional views of the memory cell array of a storage device according to a third embodiment.
Figure 17B:
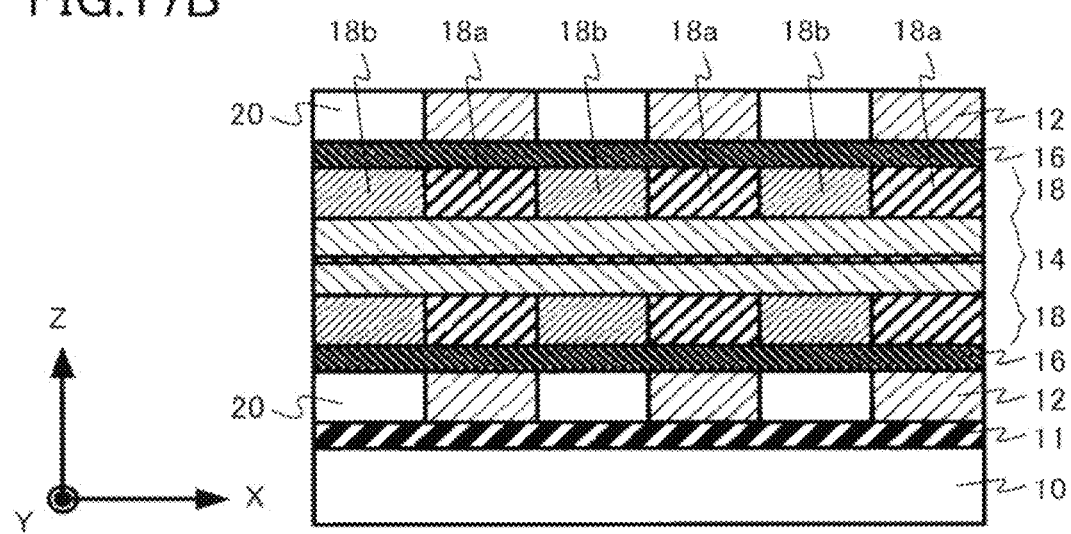

FIGS. 17A and 17B are cross-sectional views of the memory cell array of the storage device of this embodiment. FIG. 17A shows a cross-section of the memory cell array, taken along the Y-Z axis. FIG. 17B shows a cross-section of the memory cell array, taken along the X-Z axis.

In the storage device of this embodiment, two lower electrodes 12 are provided above and below an upper electrode 14. The upper electrode 14 extends in the X-direction, and also serves as the bit lines (second wirings). The lower electrodes 12 extend in the Y-direction, and also serve as the word lines (first wirings).

In the storage device of this embodiment, two layers of word lines and one layer of bit lines are stacked in the Z-direction. In each of the regions where the word lines and the bit lines intersect, two memory cells are stacked in the Z-direction.

Ferroelectric layers 18 continuously extend in the word line direction (Y-direction) and the bit line direction (X-direction) without being divided. In the regions where the ferroelectric layers 18 are located between the upper electrode 14 and the lower electrodes 12, the ferroelectric layers 18 are orthorhombic ferroelectric regions 18a. In the other regions, the ferroelectric layers 18 are monoclinic paraelectric regions 18b.

Paraelectric layers 16 continuously extend in the word line direction (Y-direction) and the bit line direction (X-direction) without being divided. In the regions where the paraelectric layers 16 are located between the upper electrode 14 and the lower electrodes 12, oxidation of the lower electrodes 12 is prevented.

In the regions other than the regions where the paraelectric layers 16 are located between the upper electrode 14 and the lower electrodes 12, the lower electrodes 12 are oxidized. Consequently, the effective thickness of the paraelectric layers 16 becomes greater outside the regions where the paraelectric layers 16 are located between the upper electrode 14 and the lower electrodes 12. Thus, crosstalk between the memory cells is reduced.

As the memory cell array has the above described multilayer structure, the storage device of this embodiment can achieve higher integration of memory cells, as well as the same effects as those of the first embodiment. Furthermore, the ferroelectric layers and the paraelectric layers continuously extend in the word line direction (Y-direction) and the bit line direction (X-direction). This eliminates the need to process the ferroelectric layers and the paraelectric layers, and manufacturing the storage device becomes easier. Also, the effective thickness of the paraelectric layers 16 becomes greater between the memory cells. Thus, crosstalk between adjacent memory cells can be reduced.

In the example shown in FIGS. 17A and 17B, two layers of word lines and one layer of bit lines are stacked in the Z-direction. However, a larger number of layers of word lines and a larger number of layers of bit lines may be alternately stacked, to further increase the degree of integration of memory cells.

In the first through third embodiments, the elements contained in the respective layers can be identified by TEM-EDX (Energy Dispersive X-ray Spectroscopy), for example.

Indeed, the storage device described herein may be embodied in a variety of other forms; furthermore, various omissions, substitutions and changes in the form of the devices and methods described herein may be made without departing from the spirit of the inventions.

What is claimed is:

1. A storage device comprising:
    a first conductive layer containing a first element selected from the group consisting of Si, Ge, and a metal element;
    a second conductive layer including a first region containing a first metal element and at least one of carbon and nitrogen, a second region containing a second metal element and at least one of carbon and nitrogen, and a third region provided between the first region and the second region, the third region containing a third metal element, a standard free energy of formation of an oxide of the third metal element being smaller than a standard free energy of formation of an oxide of the first element;
    a ferroelectric layer provided between the first conductive layer and the second conductive layer; and
    a paraelectric layer provided between the first conductive layer and the ferroelectric layer.

2. The device according to claim 1, wherein an oxygen concentration of the third region is higher than an oxygen concentration of the first region and an oxygen concentration of the second region.

3. The device according to claim 1, wherein the first region includes one of a metal nitride and a metal carbide, and the second region includes one of a metal nitride and a metal carbide.

4. The device according to claim 1, wherein the third metal element is an element selected from the group consisting of Ti, Ce, Eu, Zr, Ba, Al, Hf, Sr, La, Mg, Nd, Yb, Sm, Dy, Lu, Ho, Tm, Er, Ca, and Y.

5. The device according to claim 1, wherein the first element is an element selected from the group consisting of Ta, Nb, V, W, Fe, Mo, Co, Ni, Ru, Ir, Cu, Pd, Ag, and Pt.

6. The device according to claim 1, wherein a work function of the first conductive layer is equal to or greater than 4.5 eV.

7. The device according to claim 1, wherein the first conductive layer includes a metal compound selected from the group consisting of tantalum carbide, tantalum nitride, niobium carbide, niobium nitride, vanadium carbide, and vanadium nitride.

8. The device according to claim 7, wherein an oxygen concentration of the first conductive layer is not lower than 1 atomic percent and not higher than 10 atomic percent.

9. The device according to claim 1, wherein the ferroelectric layer includes one of hafnium oxide and zirconium oxide.

10. The device according to claim 9, wherein the hafnium oxide contains an element selected from the group consisting of Si, Zr, Al, Y, Sr, La, Ce, Gd, and Ba.

11. The device according to claim 1, wherein the paraelectric layer contains silicon oxide.

12. A storage device comprising:
    a plurality of first wirings;
    a plurality of second wirings intersecting with the first wirings; and
    a plurality of memory cells provided in regions of intersection between the first wirings and the second wirings,
    wherein at least one of the memory cells includes:
    a first conductive layer containing a first element selected from the group consisting of Si, Ge, and a metal element;

a second conductive layer including a first region containing a first metal element and at least one of carbon and nitrogen, a second region containing a second metal element and at least one of carbon and nitrogen, and a third region provided between the first region and the second region, the third region containing a third metal element, a standard free energy of formation of an oxide of the third metal element being smaller than a standard free energy of formation of an oxide of the first element;

a ferroelectric layer provided between the first conductive layer and the second conductive layer; and a paraelectric layer provided between the first conductive layer and the ferroelectric layer.

13. The device according to claim 12, wherein an oxygen concentration of the third region is higher than an oxygen concentration of the first region and an oxygen concentration of the second region.

14. The device according to claim 12, wherein the first region includes one of a metal nitride and a metal carbide, and the second region includes one of a metal nitride and a metal carbide.

15. The device according to claim 12, wherein the third metal element is an element selected from the group consisting of Ti, Ce, Eu, Zr, Ba, Al, Hf, Sr, La, Mg, Nd, Yb, Sm, Dy, Lu, Ho, Tm, Er, Ca, and Y.

16. The device according to claim 12, wherein the first element is an element selected from the group consisting of Ta, Nb, V, W, Fe, Mo, Co, Ni, Ru, Ir, Cu, Pd, Ag, and Pt.

17. The device according to claim 12, wherein a work function of the first conductive layer is equal to or greater than 4.5 eV.

18. The device according to claim 12, wherein the first conductive layer contains a metal compound selected from the group consisting of tantalum carbide, tantalum nitride, niobium carbide, niobium nitride, vanadium carbide, and vanadium nitride.

19. The device according to claim 18, wherein an oxygen concentration of the first conductive layer is not lower than 1 atomic percent and not higher than 10 atomic percent.

20. The device according to claim 12, wherein the ferroelectric layer contains one of hafnium oxide and zirconium oxide.

* * * * *